United States Patent [19]

Weiler et al.

[11] Patent Number: 5,527,742
[45] Date of Patent: Jun. 18, 1996

[54] PROCESS FOR COATED BONDING WIRES IN HIGH LEAD COUNT PACKAGES

[75] Inventors: Peter M. Weiler, Palo Alto; Thomas S. Burke, San Francisco, both of Calif.

[73] Assignee: National Semiconductor Corporation, Santa Clara, Calif.

[21] Appl. No.: 495,388

[22] Filed: Jun. 28, 1995

Related U.S. Application Data

[62] Division of Ser. No. 83,142, Jul. 26, 1993, Pat. No. 5,455,745.

[51] Int. Cl.$^6$ .................................................. H01L 21/60
[52] U.S. Cl. ..................... 437/211; 437/209; 437/214; 437/215; 437/217; 437/218; 437/219
[58] Field of Search ..................... 437/209, 211, 437/214, 215, 217, 216, 219, 220

[56] References Cited

U.S. PATENT DOCUMENTS

| | | | |
|---|---|---|---|
| 3,976,578 | 9/1976 | Murphy | 437/211 |
| 4,060,583 | 10/1977 | Groves et al. | 264/272.13 |
| 5,013,688 | 5/1991 | Yamazaki et al. | 437/211 |
| 5,045,151 | 9/1991 | Edell | 437/211 |
| 5,173,766 | 12/1992 | Long et al. | 257/687 |
| 5,196,251 | 3/1993 | Bakhru et al. | 428/76 |
| 5,227,338 | 7/1993 | Kryzaninsky | 437/211 |
| 5,310,702 | 5/1994 | Yoshidi et al. | 437/209 |
| 5,355,016 | 10/1994 | Swirbel et al. | 257/659 |

FOREIGN PATENT DOCUMENTS

| | | |
|---|---|---|
| 2-246127 | 10/1990 | Japan . |
| 3-241860 | 10/1991 | Japan . |
| 4-324941 | 11/1992 | Japan . |
| 5-074831 | 3/1993 | Japan . |
| 5-121474 | 5/1993 | Japan . |

*Primary Examiner*—Kevin M. Picardat
*Attorney, Agent, or Firm*—Hickman Beyer & Weaver

[57] ABSTRACT

A transfer molded high lead count plastic semiconductor package is described. The packaged IC chip is mounted upon a suitable leadframe and the bonding pads wire bonded to the leadframe fingers. To avoid wire shorting, due to wire sweep during transfer molding, the wires are first coated with an insulative material.

7 Claims, 4 Drawing Sheets

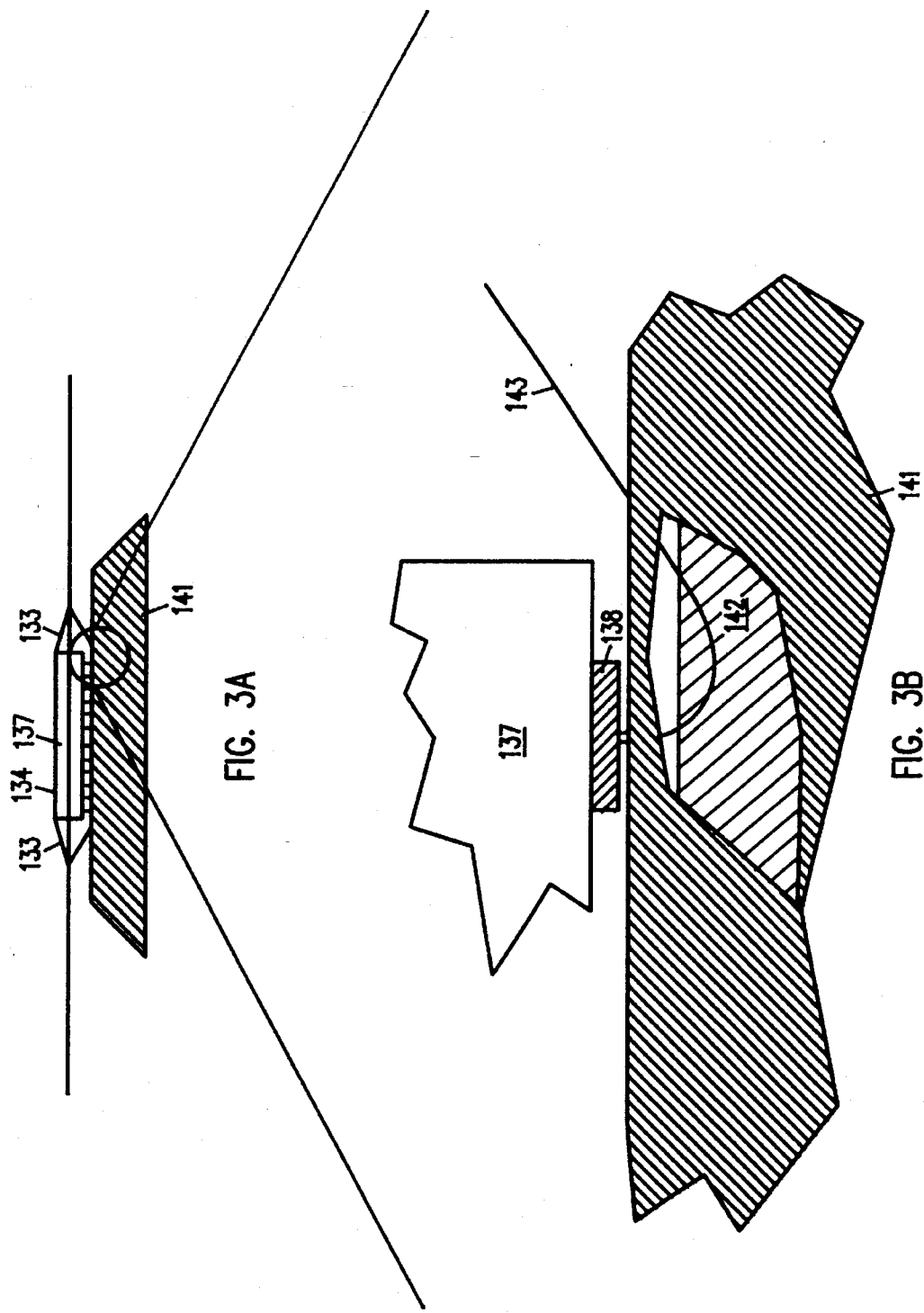

PROCESS FOR COATED BONDING WIRES IN HIGH LEAD COUNT PACKAGES

This is a divisional application of application Ser. No. 08/083,142, filed Jul. 26, 1993, and issued as U.S. Pat. No. 5,455,745 on Oct. 3, 1995.

BACKGROUND OF THE INVENTION

High lead count semiconductor device packages require a very close spacing between the bonded wires that interconnect the IC chip bonding pads with the package leadframe. If a plastic package is to be created by conventional transfer molding, the plastic flow in the process will produce wire sweep in which those wires running perpendicular to the flow will be "swept" or moved along with the flow. This can produce shorting between adjacent wires which results in a defective product. As higher lead count packages are developed, the wires are closer together and wire sweep becomes more of a problem.

FIG. 1 shows a 132 lead package structure. The outlines show the inner portions of a 132 lead pattern in a Leadframe. The peripheral numbers identify the fingers starting at 1 at the vertical center and proceeding counterclockwise around the array. Every fifth finger is shown numbered. The four fingers 133 at the four array corners support the lead frame chip mounting pad 134, which will accomodate various sized IC chips. The lead wires that interconnect the IC chip and the leadframe are identified as elements 143. Only two of the 130 wires shown are identified. Three IC chips are shown. The 1, 1.5 and 2 micron geometries, labeled 135, 136 and 137, shown are related to the IC feature size. It turns out that the smaller feature sizes result in smaller chip sizes. The following chart shows the actual physical dimensions for the three fabrication geometries illustrated in FIG. 1. The upper numbers are in mils and the lower numbers are in microns:

| FAB GEO-METRY | GATE ARRAY WIRE LAYOUT | | | | |
|---|---|---|---|---|---|
| | DIE SIZE | | | PAD | MAX WIRE |
| | X | Y | AREA | PITCH | LENGTH |
| 2 MICRON | 259/6.58 | 262/6.65 | 68K/ 43.8 | 7/0.178 | 170/4.32 |
| 1.5 MICRON | 194/4.93 | 196/4.98 | 38K/ 24.6 | 5.2/0.132 | 216/5.49 |
| 1 MICRON | 129/3.28 | 131/3.33 | 17K/ 10.9 | 3.5/0.089 | 262/6.65 |

The wire connections are shown only for the 2 micron die 137 fabrication size. Clearly, the smaller die sizes must involve closer bonding pad spacing and longer wires. In terms of wire sweep producing wire shorting, all of the FIG. 1 configurations are susceptible. The length to spacing ratio of the wires in the 2 micron geometry is almost 25:1. However, with the 1 micron geometry chip the 0.089 micron spacing and 6.65 micron length results in a ratio of almost 750:1. This large ratio is clearly much more susceptible to shorting. It would be desirable to avoid the wire shorting problems resulting from wire sweep due to molding compound flow. The most immediate solution to the problem would be to use insulated wire in the wire bonding machines. However, such insulation interferes with the machine operation and the insulation would have to be stripped from the ends of the wire being bonded, thus, making the wire bonding machines and wire handling excessively complex.

SUMMARY OF THE INVENTION

It is an object of the invention to avoid shorting due to wire sweep during the transfer molding of high lead count semiconductor device packages.

It is a further object of the invention to coat the bonded wires, in the fabrication of transfer molded high lead count semiconductor device packages, with insulation after they are installed and before transfer molding.

These and other objects are achieved as follows. A suitable polymer is dissolved in a solvent, or otherwise liquified, to produce a liquid having the desired viscosity. A lead frame with a mounted semiconductor device is provided with wire bonds in the conventional manner. The lead frame is inverted so that the bond wires project downwardly and the bond wires immersed in the liquid polymer. As the assembly is then raised, the polymer will have coated the wires. Subsequent evaporation of the solvent will leave the wires with a polymer insulation that will avoid shorting even if the wires are pushed together during transfer molding.

BRIEF DESCRIPTION OF THE DRAWING

FIG. 3A is a simplified edge view of the FIG. 2 showing during the dipping operation.

FIG. 3B is a magnified showing in partial cross section of the circled portion of FIG. 2.

DESCRIPTION OF THE INVENTION

Figure 1:
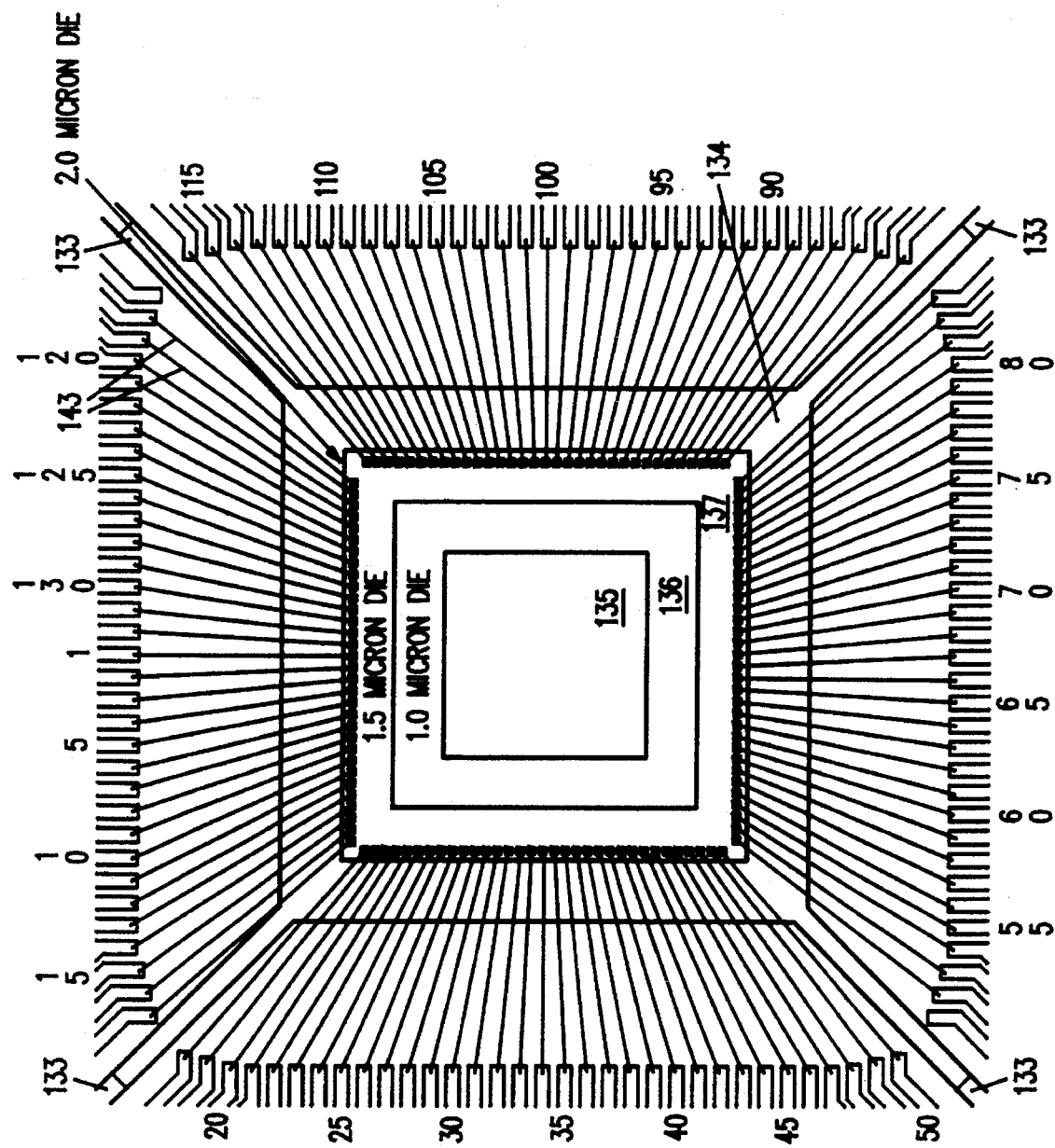
FIG. 1 is a plan view of the central portion of a conventional (prior art) leadframe pattern having a large lead count. Outlines of three different chip sizes are shown along with the bond wires that would be present for the largest chip.
Figure 2:
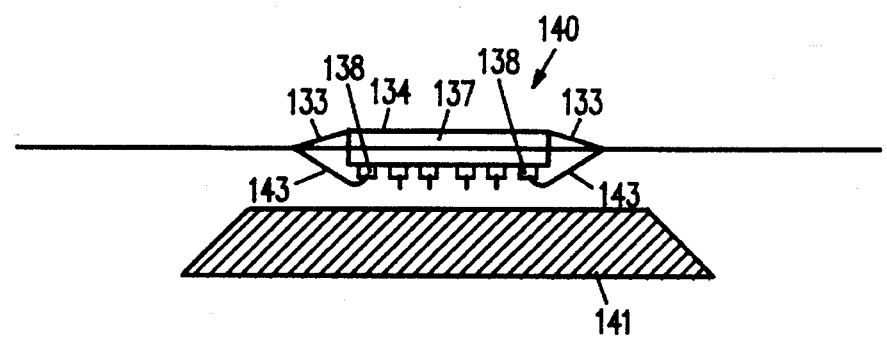
FIG. 2 is a simplified edge view of a leadframe with its mounted and wire bonded IC chip about to be dipped into a tank containing liquified polymer.

With reference to FIG. 2 a lead frame segment 140 is shown along with a semiconductor chip 137 located upon chip mounting pad 134. Wires 143 are shown bonding to the chip bonding pads 138. A tank, shown schematically at 141, contains a quantity of liquid insulative material which will be used to coat the wires. It is preferred that the insulative material be composed of a liquified polymer that has the required physical characteristics. For example, a polymer can be employed in its monomeric form as a liquid or it can be dissolved in a suitable solvent. If desired, the insulative material can be heated to modify its viscosity. The preferred viscosity is in the range of about 2,000 to 5,000 centipoises. This viscosity range will produce a liquid flow which will coat the individual wires without forming a coating that spans the space between wires. This latter condition is to be avoided because such a coating would interfere with the flow of the subsequently applied molding compound. Too low a viscosity will result in a coating that is too thin and that may not fully adhere to the wires during dipping.

As shown in FIG. 3A, the assembly 140 is dipped into the liquid insulative material so that the lead wire apexes are coated. FIG. 3B is a magnified showing of the circled portion of 3A. The portions of the lead wires 143 that are immersed in the liquid insulative material 142 would be the portion of the lead wire that would be most likely to short to the adjacent wire during the lead sweep that occurs during transfer molding. Dipping, as shown, is the preferred method of coating the wires.

Alternatively, the insulative material can be applied by way of a hollow needle that is located adjacent to lead wires 143. The needle would be translated around the mounted structure 140 to project the insulative material onto the wires.

Figure 5A:
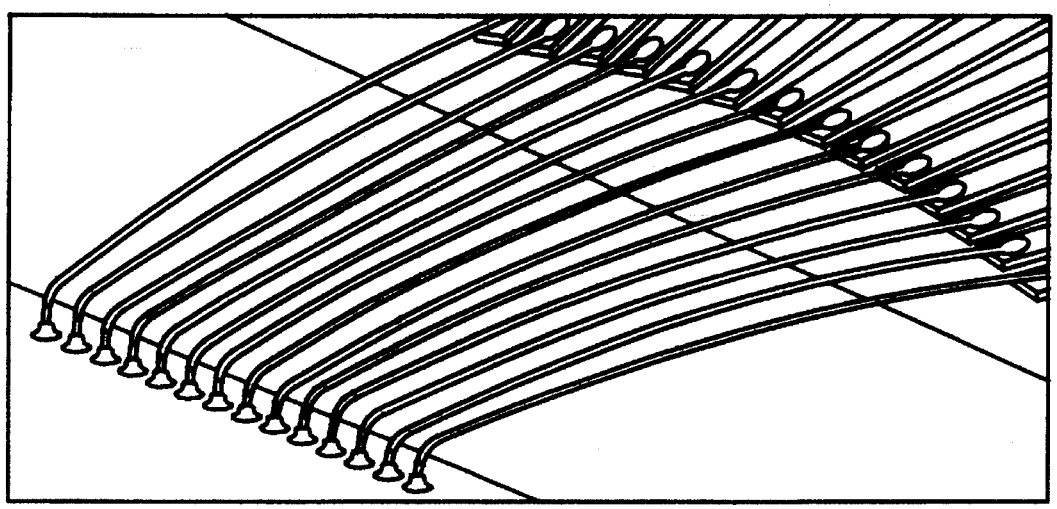
FIG. 5A is an isometric view of coated wires.
Figure 5B:
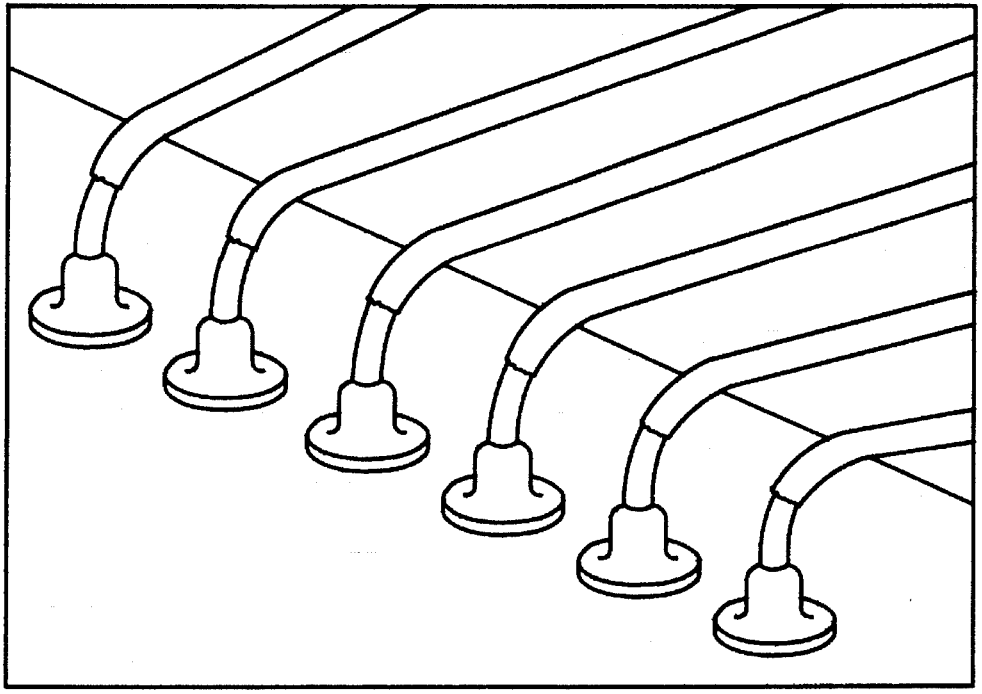
FIG. 5B is a magnified showing coating on wires.

As showing in FIGS. 5A/B, when assembly 140 is withdrawn from tank 141, the insulative material will cling to the to the wires thereby forming a coating thereon. The liquid is then solidified by solvent evaporation, polymizeration (if a monomer was used), or cooling (if thermal liquifaction was used). Typically, the assembly is passed through a heated furnace or chamber. The wires are now covered with an insulating film. FIG. 5A shows a magnified view of the individually coated bonding wires 134 ball bonded at one end to the die 137 and stitch bonded to inner leads 154 at the other end. FIG. 5B shows an enhanced view of the bonding wires 134 bonded to die 137 with a ball bond. The electrically insulative polymer 158 coats substantially the entire wire and stops just short of the bond to prevent electrical shorting between wires 134 in the event that they come into contact with each other that may result from wire sweep during injection molding of the plastic package.

Then the assembly 140, with the insulated wires in place, is located in a transfer mold (not shown) and the assembly provided with a transfer molded plastic housing in the conventional manner.

Figure 4:
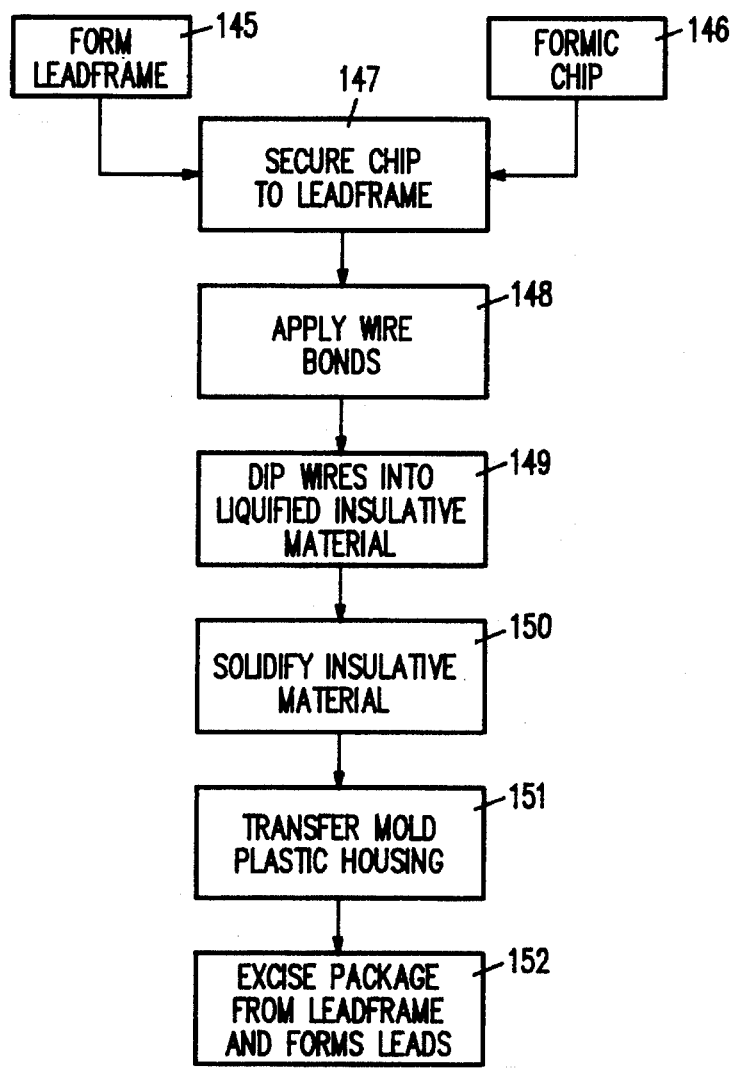
FIG. 4 is a block diagram showing the process of the invention.

FIG. 4 is a block diagram of the process that represents the preferred embodiment of the invention. In block 145 the leadframe is formed, preferably in strip form, wherein a succession of suitable patterns is formed along the strip. Such a strip can be operated in the form of a continuous tape or in short tape segments that contain only a few such patterns. The IC chips are formed in block 146 to provide the desired circuit function which typically requires a high lead count package. Gate-array chips are typical. First, the chips are secured (in block 147) to the leadframe mounting pad, by soldering or conductive adhesive, and then, in block 148, the lead wires are applied. In block 149 the liquified insulative material is applied to the bonded wire preferably by controlled dipping. In block 150, the insulative material clinging to the lead wires is solidified. Then, as shown in block 151, the plastic package is applied by transfer molding wherein the wire coating obviates the shorting typically produced by wire sweep. Then, in block 152, the packaged semiconductor device is excised from the tape and thereafter treated as a conventional packaged IC.

The invention has been described and a preferred embodiment detailed. Alternatives have also been described. When a person skilled in the art reads the foregoing description, other alternatives and equivalents, within the spirit and intent of the invention, will be apparent. Accordingly, it is intended that the scope of the invention be limited only by the claims that follow.

We claim:

1. The process for forming a high lead count molded plastic semiconductor housing comprising the steps:

forming a semiconductor device having a large number of bonding pads;

forming a leadframe having metal finger patterns and an associated device mounting pad;

bonding said semiconductor device to said mounting pad;

bonding interconnection wires between said bonding pads and said metal finger patterns;

applying an insulative coating to said wires such that each of said wires are individually coated with said insulative material to provide protection from shorting in the event that the wires come into contact with each other, and wherein said insulative material does not cover the bonding pads or a surface of the semiconductor device;

locating said leadframe along with said bonded semiconductor device and said interconnection wires in a transfer mold; and transfer molding an encapsulating plastic around said semiconductor device and portions of said leadframe whereby, when said interconnection wires are swept in said molding step said insulative coating prevents said swept interconnection wires from shorting together.

2. The process of claim 1 wherein said step of applying an insulative coating comprises the steps:

dissolving an insulative polymer in a solvent to form a liquid;

applying said liquid to coat said wires; and heating said wires, thus coated, to evaporate said solvent thereby solidifying said polymer.

3. The process of claim 1 wherein said step of applying an insulative coating comprises the steps:

applying a monomeric liquid polymer to said wires such that each of said wires is individually coated; and heating said wires to solidify said monomeric liquid, such that said monomeric liquid is polymerized.

4. The process of claim 2 wherein said step of dissolving is operated to produce a liquid having a viscosity of about 2,000–5,000 centipoises.

5. The process for forming a high lead count molded plastic semiconductor housing comprising the steps:

providing a lead frame having a plurality of inner leads;

providing a die mounting area positioned adjacent to said lead frame;

providing an integrated circuit die having a multiplicity of bond pads, said die being affixed in said die mounting area;

providing a multiplicity of bonding wires for electrically coupling the die to said inner leads, a first end of each bonding wire being bonded to an associated one of the bond pads on the die, and a second end of each bonding wire being bonded to an associated lead on the lead frame;

applying an electrically insulating coating to each of said bonding wires such that said electrically insulating coating does not cover the bonding pads or a surface of the integrated circuit die and wherein the exposed surfaces between the bonded ends of each individual wire is electrically insulated thereby preventing shorting between adjacent wires in the event that the adjacent wires come into contact with one another due to wire sweep; and encapsulating the integrated circuit die, the individually coated bonding wires, and a portion of the inner leads to provide an exterior protective package.

6. The process of claim 5, wherein said step of applying an electrically insulating coating comprises the steps:

applying a monomeric liquid polymer to said wires such that each of said wires is individually coated; and heating said wires to solidify said monomeric liquid, such that said monomeric liquid is polymerized.

7. The process of claim 5, wherein the encapsulating material is an transfer molded plastic.

* * * * *